United States Patent
Lin et al.

(10) Patent No.: US 8,878,367 B2
(45) Date of Patent: Nov. 4, 2014

(54) SUBSTRATE STRUCTURE WITH THROUGH VIAS

(75) Inventors: Chia-Sheng Lin, Taoyuan County (TW); Chien-Hui Chen, Taoyuan County (TW); Bing-Siang Chen, Taipei (TW); Tzu-Hsiang Hung, Taoyuan County (TW)

(73) Assignee: Xintec Inc., Jhongli (TW)

( * ) Notice: Subject to any disclaimer, the term of this patent is extended or adjusted under 35 U.S.C. 154(b) by 0 days.

(21) Appl. No.: 13/303,208

(22) Filed: Nov. 23, 2011

(65) Prior Publication Data

US 2012/0133049 A1    May 31, 2012

Related U.S. Application Data

(60) Provisional application No. 61/416,614, filed on Nov. 23, 2010.

(51) Int. Cl.
  *H01L 23/538* (2006.01)
  *H01L 21/50* (2006.01)
  *H01L 21/768* (2006.01)
  *H01L 23/522* (2006.01)

(52) U.S. Cl.
  CPC ...... *H01L 21/76898* (2013.01); *H01L 23/5225* (2013.01)
  USPC ............ 257/774; 257/E23.067; 257/E23.174; 257/E21.586; 257/E21.499; 257/773

(58) Field of Classification Search
  USPC .......... 257/774, E23.067, E23.174, E21.586, 257/E21.499, 773
  See application file for complete search history.

(56) References Cited

U.S. PATENT DOCUMENTS

| | | | |
|---|---|---|---|
| 6,930,033 B2* | 8/2005 | Ingerly et al. | 438/618 |
| 7,250,334 B2* | 7/2007 | Crenshaw et al. | 438/239 |
| 7,423,346 B2* | 9/2008 | Lin et al. | 257/758 |
| 7,456,097 B1* | 11/2008 | Hill et al. | 438/637 |
| 8,008,775 B2* | 8/2011 | Lin et al. | 257/758 |
| 2009/0294987 A1* | 12/2009 | Yamada et al. | 257/774 |
| 2011/0169139 A1* | 7/2011 | Lin et al. | 257/621 |
| 2011/0169159 A1* | 7/2011 | Lin et al. | 257/692 |
| 2011/0175228 A1* | 7/2011 | Lazovsky et al. | 257/768 |
| 2011/0221070 A1* | 9/2011 | Yen et al. | 257/774 |
| 2011/0285032 A1* | 11/2011 | Yen et al. | 257/774 |
| 2012/0056226 A1* | 3/2012 | Hung et al. | 257/98 |
| 2012/0175764 A1* | 7/2012 | Behammer et al. | 257/706 |

* cited by examiner

*Primary Examiner* — Alexander Oscar Williams
(74) *Attorney, Agent, or Firm* — Liu & Liu (57) ABSTRACT

A substrate structure with through vias is provided. The substrate structure with through vias includes a semiconductor substrate having a back surface and a via penetrating the back surface, a metal layer, a first insulating layer and a second insulating layer. The first insulating layer is formed on the back surface of the semiconductor substrate and has an opening connected to the through via. The second insulating layer is formed on the first insulating layer and has a portion extending into the opening and the via to form a trench insulating layer. The bottom of the trench insulating layer is etched back to form a footing portion at the corner of the via. The footing portion has a height less than a total height of the first and second insulating layers.

19 Claims, 6 Drawing Sheets

SUBSTRATE STRUCTURE WITH THROUGH VIAS

CLAIM OF PRIORITY

This application claims priority to U.S. Patent Application No. 61/416,614, filed on Nov. 23, 2010, which is incorporated by reference in its entirety.

BACKGROUND OF THE INVENTION

1. Field of the Invention

This invention relates to semiconductor devices, and, more particularly, to a method of fabricating a semiconductor device, a through substrate via process, and a substrate with through vias.

2. Description of Related Art

A through silicon via (TSV) process is popular in recent years. A substrate of a semiconductor device is etched by the TSV process to form a vertical hole. The vertical hole is filled with an insulating layer and a conductive material to form a conductive pillar. A solder ball may be disposed on the conductive pillar, to provide an electric connection interface. A cutting process and a die packaging process are then performed to form a semiconductor device.

After the substrate with through vias is formed on the substrate, the thickness of the insulating layer formed on the substrate is limited by a conventional chemical vapor deposition process, and is generally less than 2.5 micro meters. Too thick the insulating layer in the through substrate via affects the performance of a subsequent electroplating process. Moreover, a conductive layer formed in a through substrate via structure is easily affected by a dielectric constant, a thickness and a size of the insulating layer. As a result, current leakage or capacitance phenomenon may occur.

SUMMARY OF THE INVENTION

In view of the above-mentioned problems of the prior art, the present invention provides a method of fabricating a semiconductor device, a through substrate via process, and a substrate with through vias.

In an embodiment, the substrate with through vias includes: a semiconductor substrate having a back surface and a via penetrating the back surface; a metal layer formed on the semiconductor substrate and exposed from the via; a first insulating layer formed on the back surface of the semiconductor substrate and having an opening connected to the via; and a second insulating layer formed on the first insulating layer and having a portion extending to an opening wall of the opening and a via wall of the via to form a trench insulating layer, wherein the trench insulating layer is etched and a footing portion is formed at a corner formed by the via and the metal layer, the footing portion having a height less than a total height of the first insulating layer and the second insulating layer.

In another embodiment, the through substrate via process includes: forming a metal layer on a back surface of a semiconductor substrate; forming a first insulating layer on the back surface of the semiconductor substrate and patterning the first insulating layer to form an opening, with the back surface of the semiconductor substrate exposed from the opening; anisotropic etching the semiconductor substrate that is exposed from the opening to form a via penetrating the semiconductor substrate, with the metal layer exposed from the through via; forming on the first insulating layer a second insulating layer having a portion extending to an opening wall of the opening and a through via wall of the through via, so as to form a trench insulating layer covering the metal layer; and etching the trench insulating layer in the through via, to expose a portion of the metal layer.

In yet another embodiment, the method of fabricating a semiconductor device includes: disposing on a back surface of a semiconductor substrate an active element and a metal layer, and electrically connecting the active element to the metal layer; fixing a cover board to the semiconductor substrate to cover the active element and the metal layer; forming a first insulating layer on the back surface of the semiconductor substrate, and patterning the first insulating layer to form an opening, from which the semiconductor substrate is exposed; anisotropic etching the semiconductor substrate that is exposed from the opening to form a through via penetrating the semiconductor substrate, with the metal layer exposed from the through via; forming on the first insulating layer a second insulating layer having a portion extending to an opening wall of the opening and a through via wall of the through via, so as to form a trench insulating layer covering the metal layer; and etching the trench insulating layer in the via to expose a portion of the metal layer.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

In an embodiment, a chip package of the present invention may be applied to an electronic element that comprises a variety of integrated circuits, such as active elements, passive elements, digital circuits and analog circuits. For example, in opto electronic devices, micro electro mechanical systems (MEMS), micro fluidic systems, or physical sensors that performs a measure process by determining physical variations, such as heat, light and pressure, a semiconductor chip installed therein, such as an image sensing element, a light emitting diode (LED), a solar cell, an RF circuit, an accelerator, a gyroscopes, a micro actuator, a surface acoustic wave device), a process sensor and an ink printer head, is readily to be packaged in a wafer scale package (WSP) process.

In above wafer scale package process, a wafer scale package step is executed first, and the wafer is cut into a plurality of independent packages. However, in a specific embodiment, the semiconductor chips may be relocated on a carrier wafer, and then a package process is performed, which is also called the wafer scale package process. In the above wafer scale package process, a plurality of wafers that have integrated circuits may be stacked on one another, so as to form a chip package of a multi-layer integrated circuit device.

For expository purposes, the term "horizontal" as used herein is defined as a plane parallel to the plane or surface of the substrate, regardless of its orientation. The term "vertical" refers to a direction perpendicular to the horizontal as just defined. Terms, such as "on," "above," "below," "bottom," "top," "side" (as in "sidewall"), "higher," "lower," "upper," "over," and "under," are defined with respect to the horizontal plane.

Figure 1:
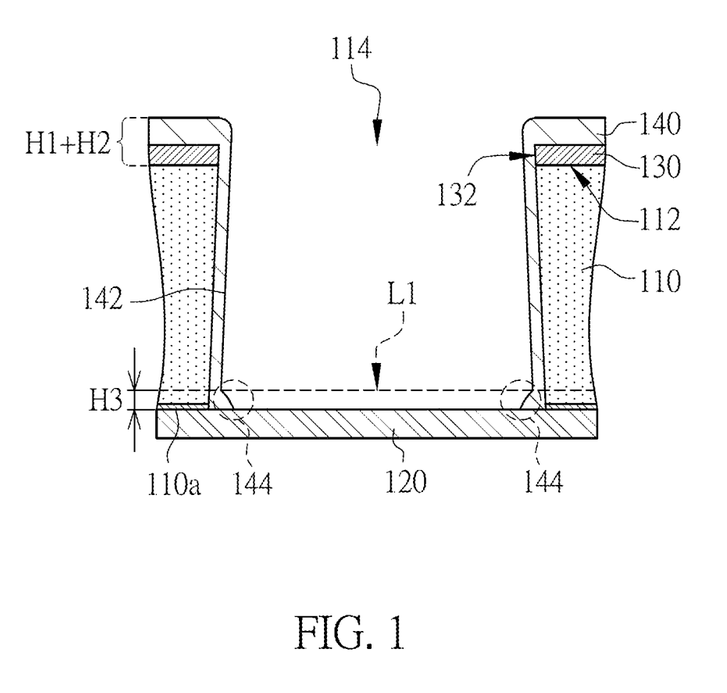
FIG. 1 is a schematic diagram of a substrate with through vias of a first embodiment according to the present invention.
Figure 2:
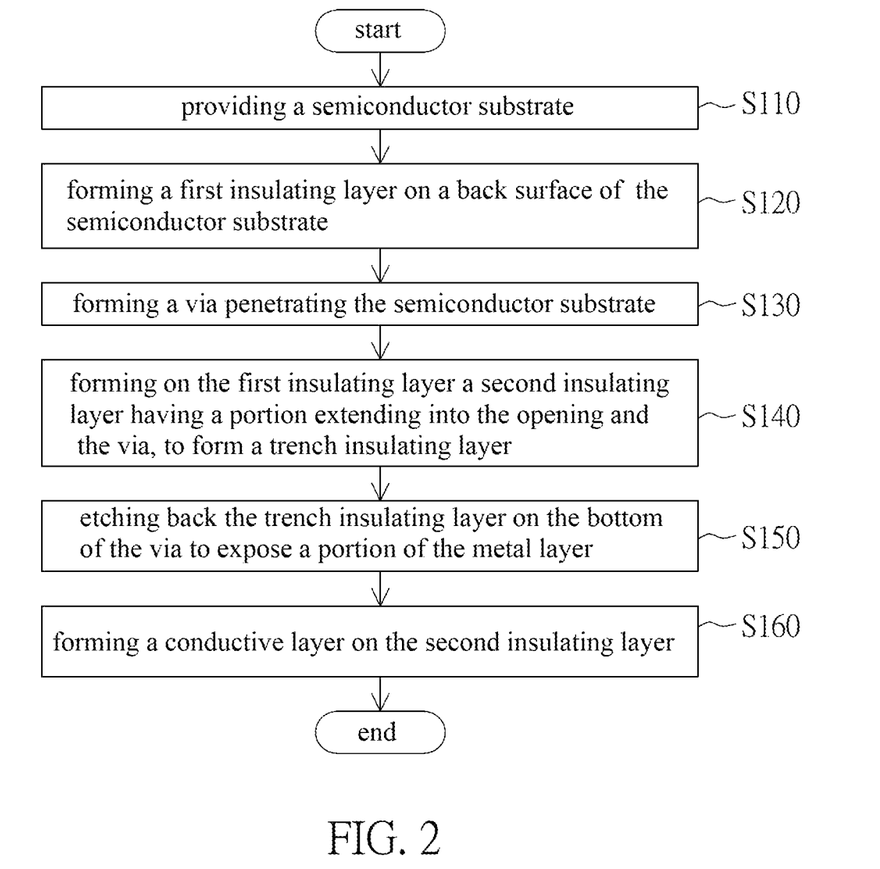
FIG. 2 is a flow chart of a process of fabricating a substrate with through vias according to the present invention.

Referring to FIGS. 1 and 2, FIG. 1 is a schematic diagram of a substrate with through vias 100 of an embodiment according to the present invention. FIG. 2 is a flow chart of a substrate with through vias process of an embodiment according to the present invention. The substrate with through vias 100 comprises a semiconductor substrate 110, a metal layer 120, a first insulating layer 130, and a second insulating layer 140. The semiconductor substrate 110 has a back surface 112 and a through via penetrating the semiconductor substrate 110. The first insulating layer 130 has an opening 132 connected to the through via 114. The second insulating layer 140 extends into the opening 132 and the via 114, to form a trench insulating layer 142. The bottom of the trench insulating layer 142 at a corner of the through via 114 is etched and a footing portion 144 is thus formed. The footing portion 144 has a height H3 less than a total height (H1+H2) of the first insulating layer 130 and the second insulating layer.

The substrate via manufacturing process includes steps S110-S160. In accordance with the substrate via process of FIG. 2, a method of fabricating the through substrate via structure 100 of FIG. 1 is described.

In step S110, a semiconductor substrate 110 is provided. In an embodiment, the semiconductor substrate 110 is a semiconductor material, such as silicon and gallium arsenide, is applied with a suitable circuit, and acts as a substrate of an integrated circuit chip, a light emitting diode chip, or a solar battery chip. A metal layer 110 is formed under the semiconductor substrate 110 (or native oxide layer 110a). The metal layer 120 is formed in a metallization process, and is made of copper, aluminum or tungsten.

In step S120, the first insulating layer 130 is formed on the back surface 112 of the semiconductor substrate 110. The first insulating layer 130 is formed on the back surface 112 of the semiconductor substrate 110 in a chemical vapor deposition process or a physical vapor deposition process. The first insulating layer 130 is made of an insulating material, such as silicon oxide, silicon nitride, or silicon oxynitride. A resist layer is applied to the first insulating layer 130, and is exposed and developed in a wet patterning process or a dry etching process, to form the opening 132 that has a predefined size. Before the etching process is performed, the back surface 112 of the semiconductor substrate 110 is exposed from the bottom of the opening 132.

In step S130, a plasma recessing is performed and a through via that penetrates the semiconductor substrate 110 is formed. In an embodiment, the through via 114 of the semiconductor substrate 110 takes an area that is exposed from the opening 132 of the first insulating layer 130 as an area of the plasma recessing, and plasma particle with high velocity may be bombarded to a location where the opening 132 is located, in order to increase the etching precision. When the plasma particles anisotropic etch a portion of the semiconductor substrate 110 under the opening 132, the through via 114 that penetrates the semiconductor substrate 110 is formed gradually. Therefore, the through via 114 vertically penetrates the semiconductor substrate 110, and the metal layer 120 is exposed from the bottom of the through via 114. In an embodiment, the bottom of the through via 114 is greater than top of the through via 114.

In step S140, the second insulating layer 140 is formed on the first insulating layer 130 in a chemical vapor deposition process or a physical vapor deposition process, and a portion of the second insulating layer 140 extends into the opening 132 and the through via 114, to form a trench insulating layer 142. The trench insulating layer 142, prior to step S150, has a bottom covering the top of the metal layer 120 (referring to the reference bottom line L1 shown in FIG. 1). The second insulating layer 140 may be an insulating material, such as silicon oxide, silicon nitride, and silicon oxynitride. In an embodiment, the first insulating layer 130 and the second insulating layer 140 may be made of the same or different materials. The thickness H1 of the first insulating layer 130 may be equal or not equal to the thickness H2 of the second insulating layer. For example, the thinner first insulating layer 130 (e.g., 1 μm) is formed and then the thicker second insulating layer 140 (e.g., 2.5 μm) is formed, or the thicker first insulating layer 130 (e.g., 2.5 μm) is formed first and then the thinner second insulating layer 140 (e.g., 1 μm) is formed. Therefore, the total height (H1+H2) of the first insulating layer 130 and the second insulating layer 140 has a predefined height, and the drawback that the thickness of the insulating layer is limited by the process is overcome.

In step S150, the trench insulating layer 142 on the bottom of the through via 114 is etched, to expose a portion of the metal layer 120. In an embodiment, the trench insulating layer 142 is etched in a dry etching (e.g., plasma) or a wet etching (e.g., hydrofluoric acid) process, to remove the trench insulating layer 142 on the bottom of the through via 114. Since an insulating layer thickening process (i.e., steps S120 and S140) is not performed and the trench insulating layer 142 is not too thick, no insulating material or solvent will remain on the metal layer 120, and the clearness of the metal layer 120 is improved.

Figure 3:
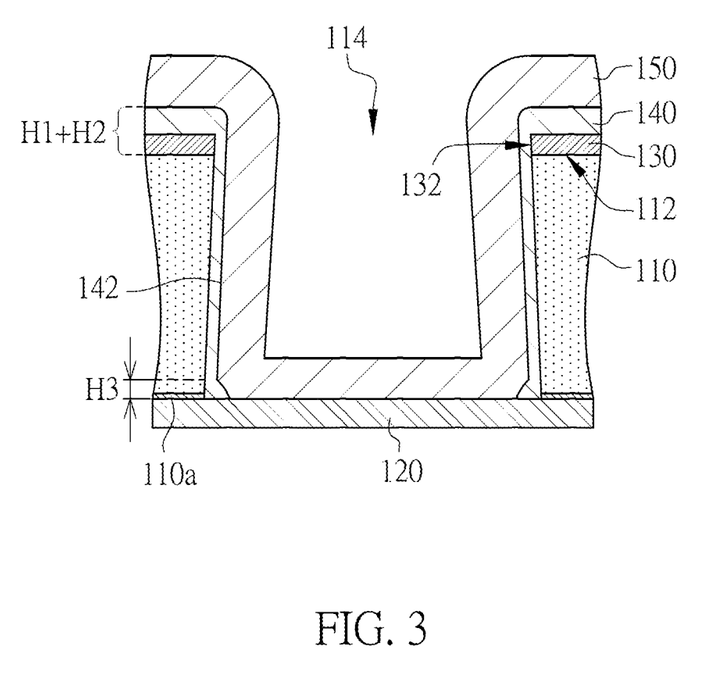
FIG. 3 is a schematic diagram of a substrate with through vias of a second embodiment according to the present invention.

Refer to FIGS. 2 and 3. FIG. 3 is a schematic diagram of a through substrate via structure of an embodiment according to the present invention. In step S160, a conductive layer 150 is further formed on the second insulating layer 140. The conductive layer 150 extends into the opening 132 and the through via 114, and is electrically connected to the metal layer 120. The conductive layer 150 is formed completely on the second insulating layer 140 by sputtering, evaporating, electroplating or electroless plating techniques, and extends into the opening 132 and the through via 114, to form a conductive via structure. The conductive layer 150 is made of a conductive material, such as copper, aluminum and nickel. In an embodiment, patterned circuits on the conductive layer 150 are formed by photolithography and etching process, and signal transmission lines and corresponding contacts are disposed by redistributing and planting processes.

Figure 4A:
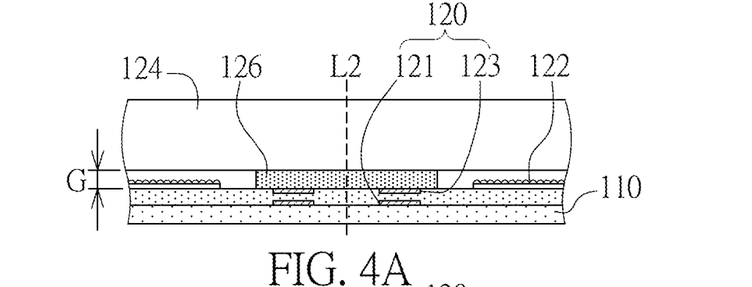
FIGS. 4A to 4F are schematic diagrams illustrating a process of fabricating a semiconductor device according to the present invention, wherein FIG. 4B' is another embodiment of FIG. 4B, and FIG. 4F' is another embodiment of FIG. 4F.

FIGS. 4A-4F illustrate a flow chart of a method of fabricating a semiconductor device of an embodiment according to the present invention. As shown in FIG. 4A, an active element 122 and a metal layer 120 are formed above the semiconductor substrate 110. The active element 122 may be an image sensing element, a transistor or a light emitting diode. The image sensing element may be a complementary metal-oxide semiconductor (CMOS) or a charge-coupled device (CCD). The metal layer 120 may be made of copper, aluminum or tungsten. The metal layer 120 is electrically connected to the active element 122.

In an embodiment, the metal layer 120 is composed of a plurality of metal layers, such as metal layers 121 and 123, which are electrically connected to each other by metal plugs. The bottommost one of the metal layer 121 is formed on the semiconductor substrate 110 directly, and the topmost one of the metal layer 123 is stacked above the bottommost one of the metal layer 121 and is electrically connected to the active element 122.

As shown in FIG. 4A, a cover board 124 is fixed to the semiconductor substrate 110. In an embodiment, the cover board 124 is fixed to the semiconductor substrate 110 by a supporting portion 126, and the active element 122 and the metal layer 120 are disposed within an area where the cover board 124 is fixed to the semiconductor substrate 110. In an embodiment, the supporting portion 126 is made of a cured material, such epoxy resin and UV gum, and is light/thermal cured to form a gap G between the cover board 124 and the semiconductor substrate 110. The metal layer 120 is covered by the bottom of the supporting portion 126, and the active element 122 is located in the gap G. In an embodiment, the cover board 124 is made of glass, quartz, plastic, or other transparent substrates, all of which allow light to pass. Therefore, the active element 122 receives external signals or emits signals in a light form.

In an embodiment, after the fixing process is complete, the semiconductor substrate 110 is thinned in a mechanical grinding process, in which the back surface 112 of the semiconductor substrate 110 is grounded, to thin the semiconductor substrate 110.

Figure 4B:
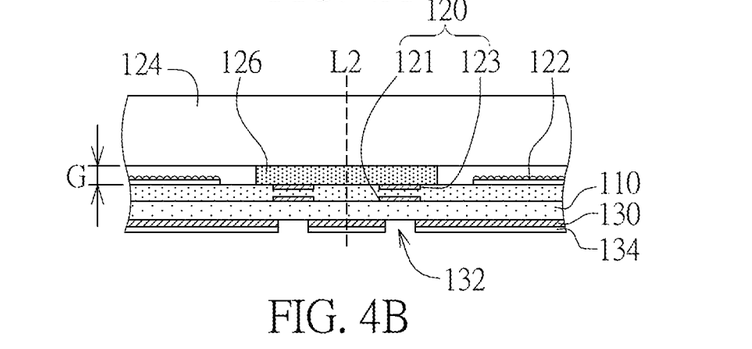

As shown in FIG. 4B, a first insulating layer 130 is formed on the back surface 112 of the semiconductor substrate 110, as described in step S120. The first insulating layer 130 is patterned to form an opening 132. The semiconductor substrate 110 is exposed from the bottom of the opening 132. In an embodiment, a patterned resist layer 134 is first formed on the first insulating layer 130, and the first insulating layer 130 is patterned, with a patterned resist as an etching mask, to form an opening 132 having a predefined size. In another embodiment, as shown in FIG. 4B', prior to the formation of the patterned resist layer 134, a metal material is formed on the first insulating layer 130, and is patterned together with the first insulating layer 130, such that the metal material acts as a shielding layer 131.

Figure 4C:
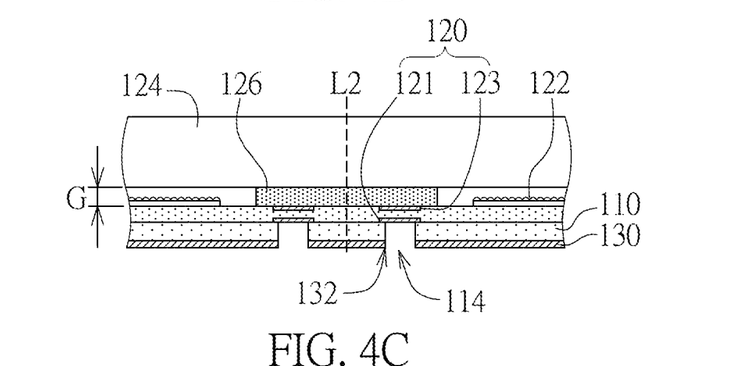

As shown in FIG. 4C, a through via 114 that penetrates the semiconductor substrate 110 is formed by a plasma recessing technique, as shown in step S130. In an embodiment, the through via 114 of the semiconductor substrate 110 takes an area exposed from the opening 132 of the first insulating layer 130 as an area where the plasma recessing technique is performed, and plasma particles with high velocity are bombarded to a location where the opening 132 is located, to improve the etching precision. Therefore, after the semiconductor substrate 110 is anisotropic etched by the plasma particles, a through via 114 that vertically penetrates the semiconductor substrate 110 is formed, and a metal layer 120 is exposed from the bottom of the through via 114.

Figure 4D:
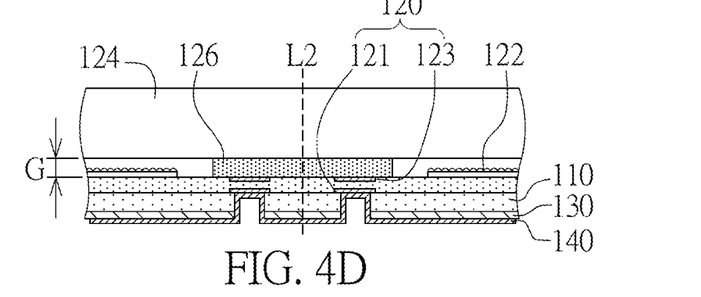

As shown in FIG. 4D, the patterned resist layer 134 is removed, to form a second insulating layer 140 on the first insulating layer 130, as shown in step S140. A portion of the second insulating layer 140 extends into the opening f132 and the via 114, to form a trench insulating layer 142. The bottom of the trench insulating layer 142 covers the metal layer 120. In an embodiment, the first insulating layer 130 and the second insulating layer 140 may be made of the same or different materials. The first insulating layer 130 and the second insulating layer 140 may be equal or unequal in thickness. For instance, the thinner first insulating layer 130 (e.g., 1 µm) is formed first and then the thicker second insulating layer 140 (e.g., 2.5 µm) is formed, or the thicker first insulating layer 130 (e.g., 2.5 µm) is formed first and then the thinner second insulating layer 140 (e.g., 1 µm) is formed, such that the total height (H1+H2) the first insulating layer 130 and the second insulating layer 140 is equal to a predefined height, and a drawback that the thickness of the insulating layer is limited and the fabrication process cannot be improved is overcome.

Figure 4E:
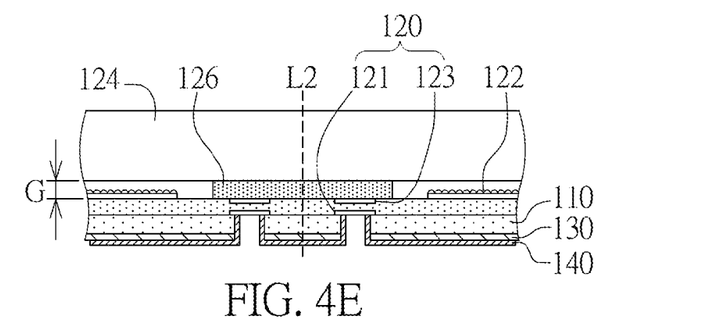

As shown in FIG. 4E, the trench insulating layer 142 on the bottom of the through via 114 is etched, to expose a portion of the metal layer 120, as shown in step S150. In an embodiment, the trench insulating layer 142 is etched in a dry etching process (e.g., plasma) or a wet etching process (e.g., hydrofluoric acid), to remove the trench insulating layer 142 on the bottom of the through via 114. Since an insulating layer thickening process (i.e., steps S120 and S140) is not performed and the trench insulating layer 142 is not too thick, no insulating material or solvent will remain on the metal layer 120, and the clearness of the metal layer 120 is improved.

Figure 4F:
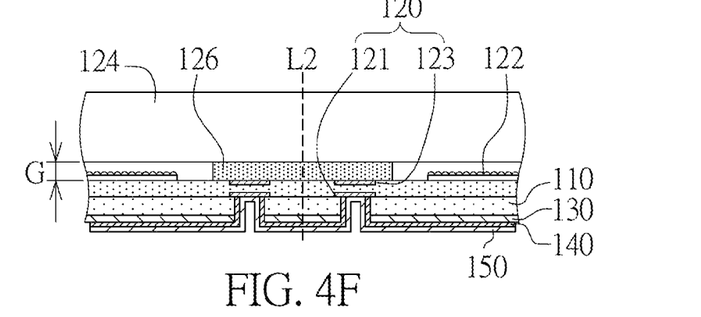

As shown in FIG. 4F, a conductive layer 150 is further formed on the second insulating layer 140, as described in step S160. The conductive layer 150 extends into the opening 132 and the through via 114, and is electrically connected to the metal layer 120. The conductive layer 150 is completely formed on second insulating layer 140 by sputtering, evaporating, electroplating or electroless plating techniques, and extends into the opening 132 and the through via 114. The conductive layer 150 may be made of a conductive material, such as copper, aluminum and nickel. In an embodiment, patterned circuits on the conductive layer 150 are formed by photolithography and etching process, and signal transmission lines and corresponding contacts are disposed by redistributing and planting processes. In an embodiment, after the above steps are executed, the cover board 124, the supporting portion 126 and the semiconductor substrate 110 are cut along a cutting line L2, to form a plurality of independent semiconductor devices.

Figure 5:
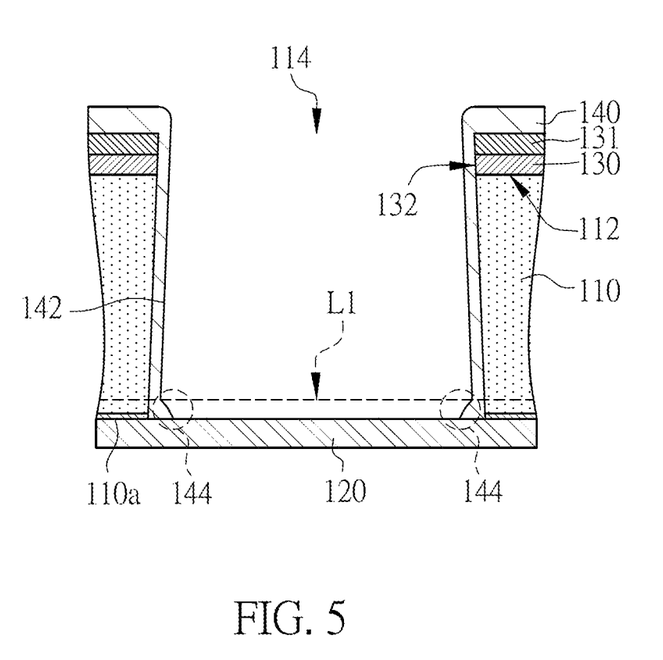
FIG. 5 is a schematic diagram of a substrate with through vias of a third embodiment according to the present invention.

Referring to FIGS. 4F' and 5, which are subsequent to the process shown in FIG. 4B', the shielding layer 131 is formed between the first insulating layer 130 and the second insulating layer 140.

It is known from the above that the method of fabricating a semiconductor device, the through substrate via process and the through substrate via structure have the following characteristics.

(1) The positioning precision is increase by using the opening of the first insulating layer, so as to form a via having a predefined size.

(2) The first insulating layer and the second insulating layer increase the insulating thickness of the back surface of the semiconductor substrate, and the leakage current and capacitance effect are omitted. Therefore, signals, when transmitted over the conductive layer do not suffer the problems of signal delay and longer rising/falling response time due to the capacitance effect.

(3) The trench insulating layer will not be too thick due to the insulating layer thickening process, and has a thickness still within a range endurable in the etching process. Therefore, no insulating material or solvent will remain on the metal layer, and the clearness of the metal layer is improved.

(4) A shielding layer is formed between the first insulating layer and the second insulating layer, to overcome the electromagnetic interference (EMI).

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A substrate structure with through vias, comprising:
a semiconductor substrate having a back surface and a plurality of through vias exposed from the back surface;
a metal layer formed on the semiconductor substrate with the through vias exposed therefrom;
a first insulating layer formed on the back surface of the semiconductor substrate and having a plurality of openings connected to the through vias; and
a second insulating layer stacked on the first insulating layer and having a portion thereof extending to an opening wall of each of the openings and a via wall of each of the through vias so as for the extending portion of the second insulating layer to form a trench insulating layer,
wherein the trench insulating layer is etched back to allow a footing portion to be formed at a corner formed by each of the through vias and the metal layer, and the footing portion has a height less than a total height of the first insulating layer and the second insulating layer that are above the back surface of the semiconductor substrate, and
wherein the bottom part of the through vias is wider than the top part of the through vias.

2. The through substrate via structure of claim 1, further comprising a conductive layer formed on the second insulating layer, extending into each of the openings and each of the through vias, and electrically connected to the metal layer.

3. The through substrate via structure of claim 1, wherein the first insulating layer is thinner than the second insulating layer.

4. The through substrate via structure of claim 1, wherein the first insulating layer is thicker than the second insulating layer.

5. The through substrate via structure of claim 1, further comprising a shielding layer formed between the first insulating layer and the second insulating layer.

6. A substrate structure with through vias, comprising:
a semiconductor substrate having a back surface and a plurality of through vias exposed from the back surface;
a metal layer formed on the semiconductor substrate with the through vias exposed therefrom;
a first insulating layer formed on the back surface of the semiconductor substrate and having a plurality of openings connected to the through vias; and
a second insulating layer stacked on the first insulating layer and having a portion thereof extending to an opening wall of each of the openings and a via wall of each of the through vias so as for the extending portion of the second insulating layer to form a trench insulating layer,
wherein the first insulating layer and the second insulating layer are made of different materials;
wherein the trench insulating layer is etched back to allow a footing portion to be formed at a corner formed by each of the through vias and the metal layer, and the footing portion has a height less than a total height of the first insulating layer and the second insulating layer stacked on the first insulating layer, and
wherein the bottom part of the through vias is wider than the top part of the through vias.

7. A process of fabricating a through substrate via, comprising:
forming a metal layer on a back surface of a semiconductor substrate;
forming a first insulating layer on the back surface of the semiconductor substrate and patterning the first insulating layer to form a plurality of openings, with the back surface of the semiconductor substrate exposed from the openings;
forming a plurality of through vias penetrating the semiconductor substrate from the openings, with the metal layer exposed from the through vias;
stacking on the first insulating layer a second insulating layer to form an interface between the second insulating layer and the first insulating layer and the second insulating layer having a portion extending to an opening wall of each of the openings and a via wall of each of the through vias, so as to form a trench insulating layer covering the metal layer; and
etching back the trench insulating layer in each of the through vias, to expose a portion of the metal layer to allow a footing portion to be formed at a corner formed by each of the through vias and the metal layer, the footing portion having a height less than a total height of the first insulating layer and the second insulating layer stacked on the first insulating layer that are above the back surface of the semiconductor substrate,
wherein the bottom part of the through vias is wider than the top part of the through vias.

8. The process of claim 7, further comprising etching back a bottom of the trench insulating layer to form at a corner formed by the through vias and the metal layer a footing portion that has a height less than a total height of the first insulating layer and the second insulating layer.

9. The process of claim 7, further comprising forming on the second insulating layer a conductive layer that extends into each of the openings and each of the through vias and is electrically connected to the metal layer.

10. The process of claim 7, wherein the anisotropic etching is plasma recessing.

11. The process of claim 7, further comprising, prior to patterning the first insulating layer, forming on the first insulating layer a shielding layer that is patterned together with the first insulating layer, such that the shielding layer is sandwiched between the first insulating layer and the second insulating layer after the second insulating layer is formed.

12. A process of fabricating a semiconductor device, comprising:
disposing on a back surface of a semiconductor substrate an active element and a metal layer, and electrically connecting the active element to the metal layer;
fixing a cover board to the semiconductor substrate to cover the active element and the metal layer;
forming a first insulating layer on the back surface of the semiconductor substrate, and patterning the first insulating layer to form a plurality of openings, from which the semiconductor substrate is exposed;
forming a plurality of through vias penetrating the semiconductor substrate from the openings, with the metal layer exposed from the through vias;
stacking on the first insulating layer a second insulating layer to form an interface between the second insulating layer and the first insulating layer and the second insulating layer having a portion extending to an opening wall of each of the openings and a via wall of each of the through vias, so as to form a trench insulating layer covering the metal layer; and etching back the trench insulating layer in the through vias to expose a portion of the metal layer to allow a footing portion to be formed at a corner formed by each of the through vias and the metal layer, the footing portion having a height less than a total height of the first insulating layer and the second insulating layer stacked on the first insulating layer that are above the back surface of the semiconductor substrate, wherein the bottom part of the through vias is wider than the top part of the through vias.

13. The process of claim 12, wherein etching back the trench insulating layer forms at a corner formed by the via and the metal layer a footing portion having a height less than a total height of the first insulating layer and the second insulating layer.

14. The process of claim 12, further comprising forming on the second insulating layer a conductive layer that extends into each of the openings and each of the through vias and is electrically connected to the metal layer.

15. The process of claim 12, further comprising, prior to patterning the first insulating layer, forming a patterned resist layer on the first insulating layer.

16. The process of claim 12, wherein the anisotropic etching is plasma recessing.

17. The process of claim 12, wherein the active element is an image sensing element, a transistor or a light emitting diode.

18. The process of claim 12, further comprising:
providing a supporting portion; and
fixing the cover board to the semiconductor substrate with the supporting portion, to form a gap between the cover board and the semiconductor substrate,
wherein the active element is disposed in the gap.

19. The process of claim 12, further comprising, prior to patterning the first insulating layer, forming on the first insulating layer a shielding layer that is patterned together with the first insulating layer, such that the shielding layer is sandwiched between the first insulating layer and the second insulating layer after the second insulating layer is formed.

* * * * *